United States Patent [19]
Manning et al.

[11] Patent Number: 5,909,617
[45] Date of Patent: Jun. 1, 1999

[54] METHOD OF MANUFACTURING SELF-ALIGNED RESISTOR AND LOCAL INTERCONNECT

[75] Inventors: H. Monte Manning, Kuna; Shubneesh Batra, Boise, both of Id.

[73] Assignee: Micron Technology, Inc., Boise, Id.

[21] Appl. No.: 08/553,143

[22] Filed: Nov. 7, 1995

[51] Int. Cl.$^6$ ............................................. H01L 21/8242
[52] U.S. Cl. .......................... 438/238; 438/382; 438/647
[58] Field of Search ............................... 437/47, 52, 60, 437/918, 192, 200; 257/904; 148/DIG. 136; 438/238, 382, 648, 647, 649, 655, 656, 657

[56] References Cited

U.S. PATENT DOCUMENTS

| | | | |
|---|---|---|---|
| 5,159,430 | 10/1992 | Manning et al. | 357/51 |
| 5,172,211 | 12/1992 | Godinho et al. | 257/536 |
| 5,177,030 | 1/1993 | Lee et al. | 437/47 |
| 5,185,285 | 2/1993 | Hasaka | 437/60 |
| 5,198,382 | 3/1993 | Campbell et al. | 437/46 |
| 5,232,865 | 8/1993 | Manning et al. | 437/60 |
| 5,236,865 | 8/1993 | Sandhu et al. | 437/174 |
| 5,286,663 | 2/1994 | Manning | 437/41 |
| 5,306,951 | 4/1994 | Lee et al. | 257/755 |
| 5,341,016 | 8/1994 | Prall et al. | 257/412 |
| 5,348,901 | 9/1994 | Chen et al. | 437/47 |
| 5,378,641 | 1/1995 | Cheffings | 437/35 |
| 5,405,791 | 4/1995 | Ahmad et al. | 437/34 |
| 5,462,894 | 10/1995 | Spinner et al. | 437/195 |

OTHER PUBLICATIONS

S. Wolf and R.N. Tauber "Silicon Processing for the VLSI Era vol. 1—Process Technology", Lattic Press, 1986, pp. 397–399.

*Primary Examiner*—Joni Chang
*Attorney, Agent, or Firm*—Knobbe, Martens, Olson & Bear, LLP

[57] ABSTRACT

A method is provided for combining the process steps for forming a resistor and interconnect into one process layer, thus eliminating the need for at least two mask steps. An oxide layer is formed over a region of a polysilicon layer in which the resistor will be formed. The oxide protects the resistor from further processing. A conductive layer is then deposited at least over the exposed portion of the polysilicon layer. In a first preferred embodiment, a refractory metal forms the conductive layer. The refractory metal is sintered or heated to form silicide over the exposed portion of the polysilicon layer, and the non-silicided metal is removed. The underlying layer may be doped as desired, before or after silicidation, for the first preferred embodiment. Thus, a resistor and conductive interconnect is formed within the same layer. Also disclosed is an embodiment in which the conductive layer need not be sintered, and an embodiment in which the resistor is formed in the sidewalls of a vertical cavity.

5 Claims, 6 Drawing Sheets

METHOD OF MANUFACTURING SELF-ALIGNED RESISTOR AND LOCAL INTERCONNECT

This invention was made with Government support under Contract No. MDA 972-92-C-0054 awarded by Advanced Research Projects Agency (ARPA). The Government has certain rights in this invention.

BACKGROUND OF THE INVENTION

The present invention relates to the fabrication of resistors and interconnect layers, and more particularly to the fabrication of resistor loads and interconnect layers for memory cells.

As is well known in the art, integrated circuits often make use of multiple interconnecting layers. Such arrangements reduce chip area for a given number of devices or circuit elements. Resistors, forming one class of those elements, are often used as load elements in circuits and particularly in static random access memory (SRAM) cells.

Additionally, circuit elements and layers must be electrically connected to one another by way of conductive interconnect lines. Traditionally, these lines have been fabricated by depositing at least one metallization layer. Long connections are ideally formed of materials having very low resistivity, such as aluminum. For local interconnect of nearby elements and interlayer connection, such extremely low resistivity is not critical, though resistivity should not be excessively high.

Polycrystalline silicon, or polysilicon for short, provides fairly good conduction for interconnection over short distances, especially when heavily doped. More importantly, it may be doped with n- or p-type dopants to provide good ohmic (low resistance) contact to similarly doped active areas.

Alternatively, silicide may be used as an interconnect layer. Refractory metal silicides, and especially titanium silicide (TiSi$_2$), are increasingly used to form interconnects for integrated circuits. Like doped polysilicon, refractory metal silicides form good ohmic contact with silicon, but suicides also have lower sheet resistivity and thus low overall resistivity. Furthermore, silicides can form good ohmic contact, without doping, to both n- and p-type device regions.

One common method of forming metal silicide is a self-aligned silicidation process, often referred to as "salicidation." A thin layer of refractory metal, such as tungsten or titanium, is deposited over a polysilicon layer or other silicon source. For example, titanium metal may be deposited over a dielectric layer and into a contact window formed through the dielectric. The titanium thus contacts an underlying polysilicon layer at the contact window. During a high temperature first sinter step in a nitrogen environment, titanium reacts with the silicon exposed at the contact to form titanium silicide (predominantly TiSi$_2$). The titanium which overlies the dielectric reacts with ambient nitrogen to form titanium nitride (TiN). After the first sinter, the TiN and unreacted titanium may be removed in a wet etch and a final sinter is performed to lower the silicide's sheet resistance to acceptable levels. The final sinter converts the titanium from the C49 phase to the lower resistance C54 phase.

The multiple layers required to form integrated circuits require several mask steps. Each additional mask which is required entails additional expense and time. For example, fabrication of an SRAM memory cell, including load elements, typically requires at least four layers on top of the substrate: (1) a first polysilicon layer to form transistor gates; (2) a second polysilicon layer for providing local interconnect; (3) a third polysilicon layer to form the resistor; and (4) a metallization layer for forming interconnect with other circuit elements outside the memory array.

Thus, a need exists for a low cost process for forming resistors and interconnect in the same layer, thereby requiring fewer mask steps than past processes have required.

SUMMARY OF THE INVENTION

A method is provided for forming a resistor and local interconnect from a single polysilicon layer. An insulating layer overlies circuit elements. At least one contact window to the appropriate circuit node (or nodes) is opened in the insulating layer. A polysilicon layer is deposited over the insulating layer. Next, a second insulating layer, such as an oxide, is deposited over a region of the polysilicon which is to become the resistor, leaving a region of exposed polysilicon. After the second insulating layer has been defined, the exposed polysilicon may be doped as desired. A conductive layer is then deposited, either before or after the doping step.

In a first preferred embodiment, the conductive layer comprises a refractory metal and the structure is sintered in a salicidation process. Silicide forms on the exposed polysilicon, partially consuming the polysilicon, but silicide does not form under nor over the second insulating layer. The polysilicon layer may be heavily doped after formation of the second insulating layer. The region of polysilicon underlying the second insulating layer is shielded from the dopants and so becomes the middle portion of a back-to-back diode resistor. The silicide serves as a local interconnect, electrically connecting the resistor to other circuit nodes or to metal lines.

In a second preferred embodiment, the conductive layer need not be sintered. For example, a refractory metal or a silicide may be deposited over the second insulating layer and the exposed polysilicon region. The conductive layer may then be selectively removed from at least a portion of the second insulating layer. Alternatively, the conductive layer may be selectively deposited over the exposed polysilicon region.

In one application, the resistor may be formed in the vertical sidewall of a cavity etched through an insulating layer to underlying circuit elements.

DETAILED DESCRIPTION OF THE PREFERRED EMBODIMENTS

Figure 1:
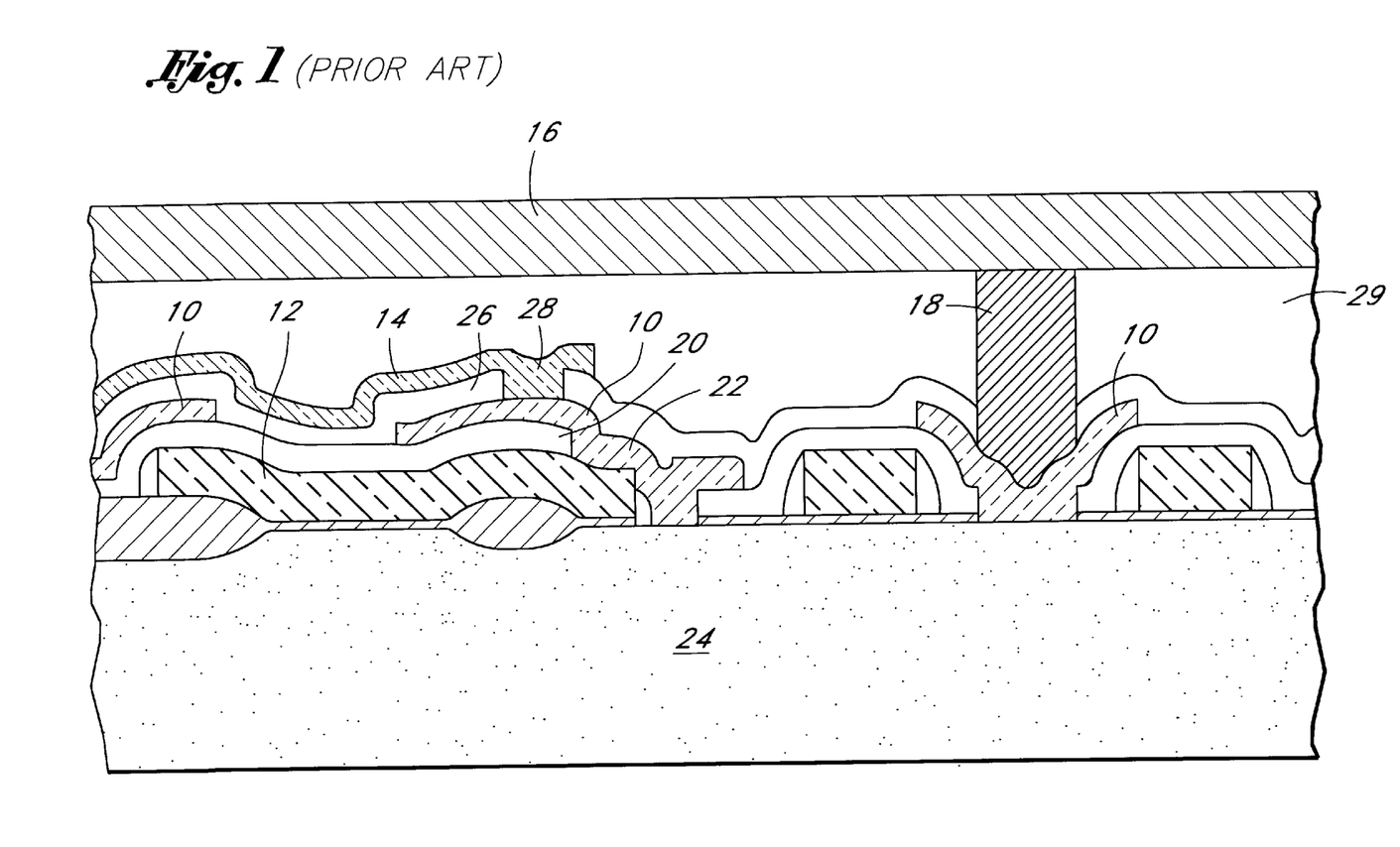
FIG. 1 is a partial sectional view of a prior art static random access memory (SRAM) cell, showing three polysilicon layers and two metallization layers.

Prior art integrated circuits, such as the SRAM illustrated in FIG. 1, typically include both a load resistor layer and a local interconnect layer. The local interconnect layer is used to connect the internal nodes of the SRAM cell, as well as to bring supply voltages into the cell. This is usually formed on a second layer of polysilicon 10 (or polycide). A first layer of polysilicon 12 (or polycide) serves as gate polysilicon for memory cell devices. The resistor is usually formed in a third layer of polysilicon 14. A metallization layer 16 connects the memory cell to circuitry outside the memory array by way of a tungsten-filled via, or plug 18. Thus, totals of three polysilicon layers (12, 10, 14) and one or two layers of metallization (16, 18) are commonly used for SRAMs having integrated resistor loads.

During the formation of the prior art circuit of FIG. 1, the first polysilicon layer 12 and the second polysilicon layer 10 are separated by a thin, conformal dielectric layer 20, except at a butting contact 22. The butting contact also connects these layers to an underlying silicon substrate 24. The second polysilicon layer 10 and the third polysilicon layer 14 are similarly separated by a conformal dielectric 26, except at a contact window 28. On the other hand, the metallization layer 16, for long range interconnection, is separated from the underlying circuitry by a thick, planarized insulating layer 29.

In contrast to the three polysilicon and two metal layers of the prior art, the present invention allows a single polysilicon layer to be processed into a resistor and a low resistance local interconnect, by use of salicidation (self-aligned silicidation). This process eliminates the polysilicon mask and the interlayer contact mask which would otherwise be required for a third layer of polysilicon and its electrical connection in an SRAM cell.

Figure 2:
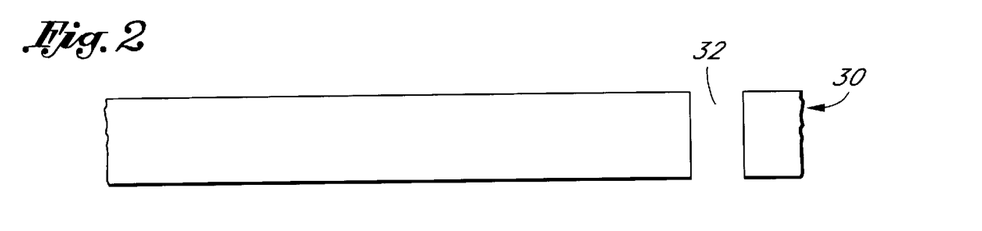
FIGS. 2–7 are partial schematic sectional views of an integrated circuit which generally illustrate method steps for fabricating a resistor and interconnect in accordance with a first preferred embodiment of the present invention.

Referring now to FIG. 2, a starting point for a first preferred embodiment of the present invention is shown schematically. A layer of dielectric or insulating material 30, preferably an oxide, may cover the underlying circuit elements. Since FIG. 2 is simply a schematic representation, the underlying circuit elements are not shown, but they may be SRAM transistors, including gate electrodes 12 and silicon substrate 24, as shown in FIG. 1. Alternatively, the present invention may be implemented in conjunction with underlying capacitors, diodes, or any other circuit elements. The insulating layer 30 of the present invention may take the form of a thin conformal dielectric such as those represented by reference numerals 20 and 26 in FIG. 1, or the insulating layer 30 may be a thick, planarized insulating layer such as that represented by reference numeral 29 of FIG. 1.

A contact window 32 may be provided through the insulating layer 30 to provide contact between the resistor to be formed and the active areas or nodes of underlying circuit elements. It should be understood that, just as the insulating layer 30 of FIG. 2 may represent either a thin conformal or thick planarized layer, as described above, so the contact window 32 may similarly represent any of a number of different configurations. Thus, the contact window 32 may resemble one of the three different contact windows illustrated in prior art FIG. 1: a simple contact through a thin layer to a single layer of underlying material, such as contact window 28 of FIG. 1; a "butting contact" bridging multiple underlayers, such as butting contact 22 of FIG. 1; or a contact via through a thick insulating layer, such as the tungsten-filled via 18 of FIG. 1. Furthermore, the contact may actually be formed through not only the insulating material 30, but also may penetrate one or more underlying conductors to make connections to other layers, as will be understood by those skilled in the art. Both the insulating layer 30 and the contact window 32 are known in the art and thus need not be described in detail here.

Next, a thin polysilicon layer 34 (FIG. 3) is deposited by known means onto the insulating layer 30. Preferably, this polysilicon layer 34 is thin enough to be suitable for formation of a "back-to-back diode" resistor. At the same time, for a first preferred embodiment, the polysilicon layer 34 should preferably be thick enough to allow later silicidation without consuming the entire polysilicon layer 34.

Figure 3:
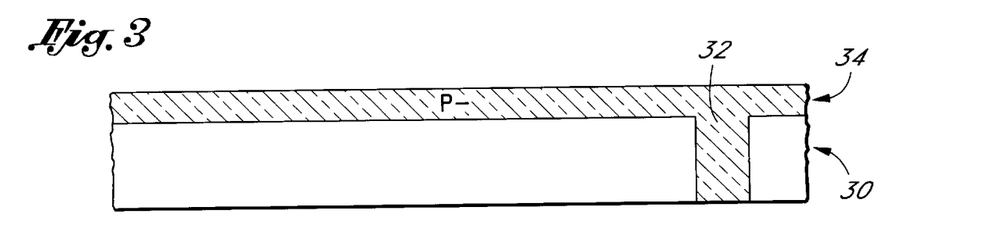

The polysilicon may also be deposited into the contact opening 32 in order to provide electrical connection to underlying circuit nodes or layers. Because FIG. 3 is schematic and drawn to represent a number of possible configurations, the drawing is not proportional. Additionally, a conductive material other than polysilicon may fill the opening (completely or partially) and provide conduction through the opening.

The deposited polysilicon layer 34 may or may not completely fill the contact opening 32. For instance, if the contact opening was less than 2000 Å in diameter, and the polysilicon layer was greater than 1000 Å in thickness, then the polysilicon deposition would completely fill the contact opening. If, however, the polysilicon layer was less than half as thick as the diameter of the contact opening, then the polysilicon deposition will not completely fill the contact opening. FIG. 3 illustrates a contact opening 32 of typical diameter, between 0.25 $\mu$m and 0.50 $\mu$m, and preferably about 0.35 $\mu$m. The polysilicon layer 34 thickness is preferably be between about 200 Å (0.02 $\mu$m) and 1000 Å (0.10 $\mu$m), and most preferably about 500 Å. For the dimensions of the first preferred embodiment, the contact opening 32 would not be completely filled. It should be understood that different types of contact windows, discussed above, may be partially or completely filled with a conductive material.

After the polysilicon layer 34 has been deposited, it may be lightly doped with either n-type or p-type dopants. For SRAM memory cells using NMOS bulk transistors for access and pull-down devices, p-type dopants are preferred for lightly doping the polysilicon layer 34 at this stage in the process. Most preferably, an implantation of boron difluoride ($BF_2$) at a dose of about $2.5 \times 10^{13}$ ions/cm$^2$ with an energy of about 45 keV is utilized for this light doping step. Of course, it will be understood that other methods of doping the polysilicon may be used.

A second insulating layer 40 (FIG. 4), preferably a dielectric and most preferably an oxide such as silicon dioxide, is then formed and patterned by conventional means to cover the polysilicon layer 34 where the resistor is to be formed. This layer will be referred to as an oxide layer 40, to distinguish the insulating layer 30, but it will be understood that other materials may equally serve its function. The oxide layer 40 may be grown or deposited by means known in the art of circuit fabrication.

Figure 4:
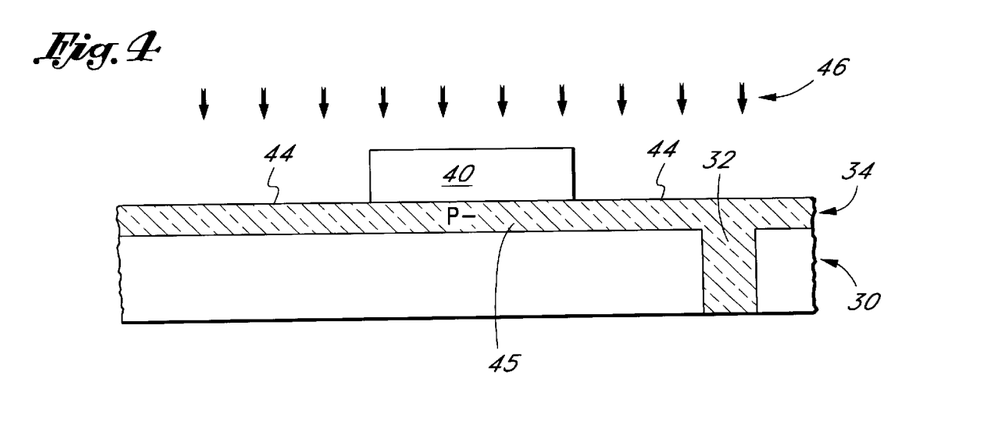

The oxide layer 40 defines exposed polysilicon regions 44 and shielded polysilicon regions 45. It may be deposited by chemical vapor deposition (CVD) or by any other known process, preferably to a thickness between about 200 Å and 1000 Å, and most preferably about 500 Å. This oxide layer 40 serves to shield the lightly doped shielded polysilicon region 45 from later metal or silicide depositions and any subsequent doping operations.

Figure 5:
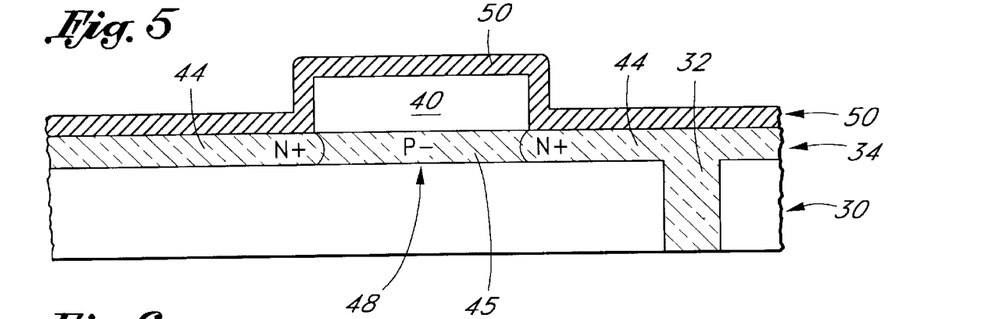

At this point, the exposed polysilicon regions 44 may be optionally implanted with a high dose of dopant. The implant is represented in FIG. 4 by arrows 46. If $BF_2$ has been previously used to lightly dope the polysilicon layer 34, then arsenic or phosphorus may be used to implant the exposed polysilicon regions 44. It will be understood, of course, that the dopant types may be reversed. Additionally, both implants may be of the same type, depending upon the operational requirements for current passing through the resistor, as will be understood by those skilled in this art. The implant is not necessary at this stage, however, and may be delayed until after salicidation. The implanted regions 44, in combination with the shielded polysilicon regions 45, form the back-to-back diode that serves as a resistor 48 (FIG. 5). The oxide layer 40 blocks the implant from entering the shielded regions 45 of the polysilicon layer 34 which underlie the oxide layer 40. The implant may be performed before or after removing the photoresist which is used in patterning the oxide layer 40. If the implant is performed after photoresist removal, then the oxide layer 40 must be thick enough to completely block the implant used to dope the exposed polysilicon regions 44.

If the exposed polysilicon regions 44 connect to both n-type and p-type nodes of the circuit, it may be necessary to dope some exposed polysilicon regions 44 n-type and some p-type to provide ohmic contact to other layers or circuit nodes. The conductive strap provided by later process steps will shunt any parasitic diodes formed at junctures of differently doped exposed polysilicon regions 44. Such a diode shunt function is disclosed in U.S. Pat. No. 5,286,663, issued to Manning, which is hereby incorporated by reference.

The next step is deposition of a conductive layer 50 over the oxide layer 40 and exposed polysilicon regions 44, as seen from FIG. 5. The conductive layer may comprise a metal or silicide deposited at least over the exposed polysilicon regions 44. A first preferred embodiment, illustrated in FIGS. 5 to 7, incorporates a salicidation process followed by selective etch. For this embodiment, a refractory metal is deposited for the conductive strap. Any known method may be used, but the first preferred embodiment incorporates a metal sputter deposition. Refractory metals are preferred and titanium is most preferred, as titanium is known to have the lowest resistivity of the refractory metals. The thickness of the metal layer depends on the thickness of the underlying polysilicon layer 34 but is preferably between 100 Å and 1000 Å, and most preferably about 300 Å.

Figure 6:
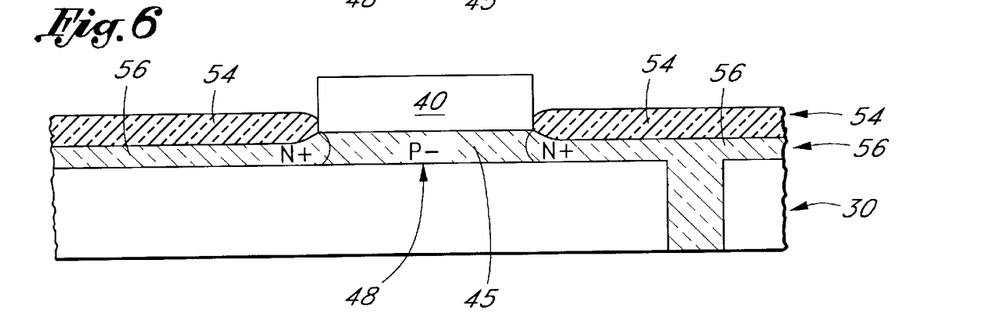

FIG. 6 illustrates the result of the first preferred embodiment, wherein a standard salicidation process, which is known in this art, may follow the metal deposition. As an example, if titanium metal has been deposited in the previous step, then a first anneal at about 650° C. is performed for about 30 seconds a substantially anaerobic environment such as in a nitrogen environment. A silicide 54, preferably predominantly $TiSi_2$, is formed over the exposed polysilicon regions 44. A layer of titanium nitride (not shown) is often also formed during salicidation. Excess or unreacted titanium and titanium nitride (or other refractory metal) may then be selectively removed or washed by a conventional etch employing hydrogen peroxide ($H_2O_2$) and sulfuric acid ($H_2SO_4$). The oxide layer 40 which protected the resistor 48 during doping and salicidation may also be optionally removed. A final anneal at about 800° C. for about 20 seconds is performed in the preferred embodiment to form the final C54 phase titanium silicide 54 over a layer of unconsumed polysilicon 56 in the preferred embodiment. It will be understood, however, that alternative silicide materials may not require this final anneal step. The product of these salicidation and selective removal steps is illustrated in FIG. 6.

Figure 8:
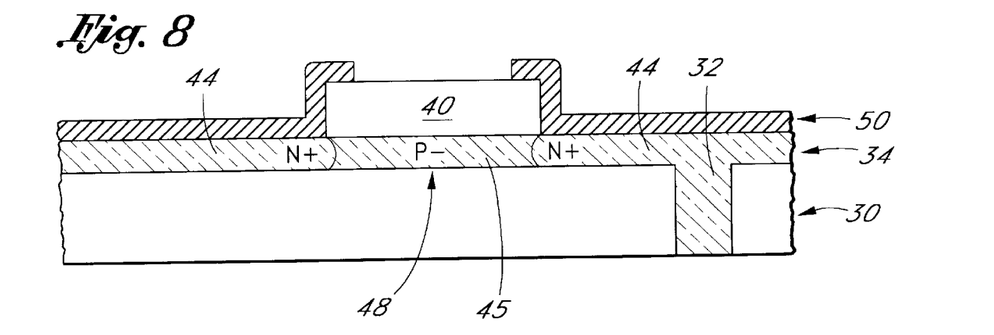
FIG. 8 is a partial schematic sectional view of an integrated circuit constructed in accordance with a second preferred embodiment of the present invention.

For a second preferred embodiment, no salicidation is required after the conductive layer 50 is deposited. The conductive layer may comprise a sputter-deposited refractory metal, as with the above-described first embodiment, or a deposited silicide. If silicide is deposited, CVD methods are preferred. For this second embodiment, the conductive layer 50 may be selectively deposited over only the exposed polysilicon regions 44, as illustrated in FIG. 8. Alternatively, the metal or silicide may be deposited over the oxide layer 40 and exposed polysilicon 44, as illustrated in FIG. 5 with regard to the first preferred embodiment. However, rather than employing the selective metal etch after sintering, the conductive layer 50 may be planarized using CMP processes, or patterned by conventional photolithographic processes and then etched, so as not to bridge the oxide layer 40. Whether selectively deposited or deposited and then patterned and etched, the result of the second preferred embodiment may resemble the circuit of FIG. 8.

Figure 7:
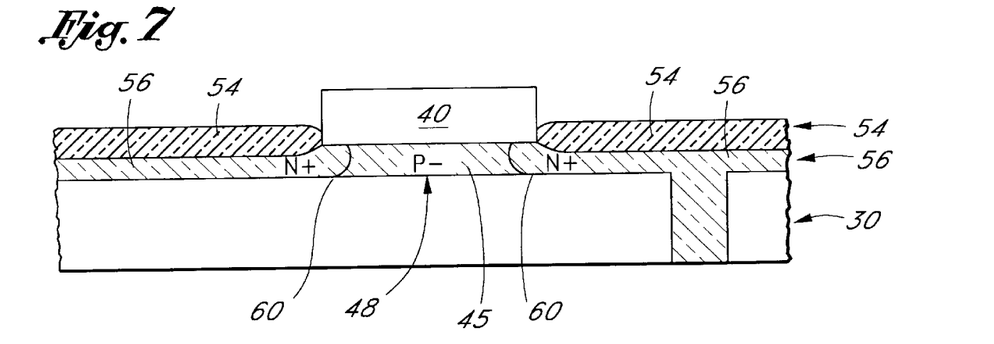

Returning now to the first preferred embodiment, if implantation of the exposed polysilicon regions 44 was not performed prior to salicidation, the underlying polysilicon 56 may be doped after salicidation. The oxide layer 40 prevents the implant from entering the shielded polysilicon region 45. With post-salicidation doping, subsequent heat treatments will drive the dopants from the silicide 54 to the unconsumed polysilicon 56, and laterally under the oxide layer 40. FIG. 7 illustrates the structure after further high temperature processing. Such high temperatures are often required to activate dopants or to flow boron phosphosilicate glass (BPSG). A pair of p-n junctions 60, which serve as diodes for the back-to-back diode resistor 48, are thus isolated from the silicide 54 and the resistor characteristics of each diode 60 are left unaffected by the silicide.

After doping and salicidation, the silicide/polysilicon layer is preferably patterned and etched to form the resistor and interconnect regions. Since the silicide 54 is formed prior to patterning the interconnect layers, agglomeration of the silicide 54 is reduced. Agglomeration of $TiSi_2$ is known to occur with the reduction of interconnect line width required by current circuit integration. Since silicide grains formed over unpatterned polysilicon are larger than grains that would form over pre-patterned polysilicon, the silicide 54 of the preferred embodiment is less susceptible to agglomeration at the elevated temperatures typical of later process steps. For this reason, patterning after salicidation is preferred.

It can be seen that the present invention permits formation of the resistor 48 and silicide interconnect 54 from a single polysilicon layer 34 (FIG. 2). In this way, the interlayer contact mask and polysilicon masks may be eliminated from the typical process flow for forming an SRAM having integrated resistor loads.

FIGS. 9–13 illustrate another embodiment of the present invention, in which the load element is formed in the sidewall of a vertical cavity leading down to the circuit elements. As with the above-described embodiments, a single polysilicon layer may be used to form both the load elements and supply line. The resistor is formed in series with a silicide supply line. At the same time, silicide formed elsewhere may serve as the local interconnect if patterned appropriately, as will be understood by one of skill in this art.

Figure 9:
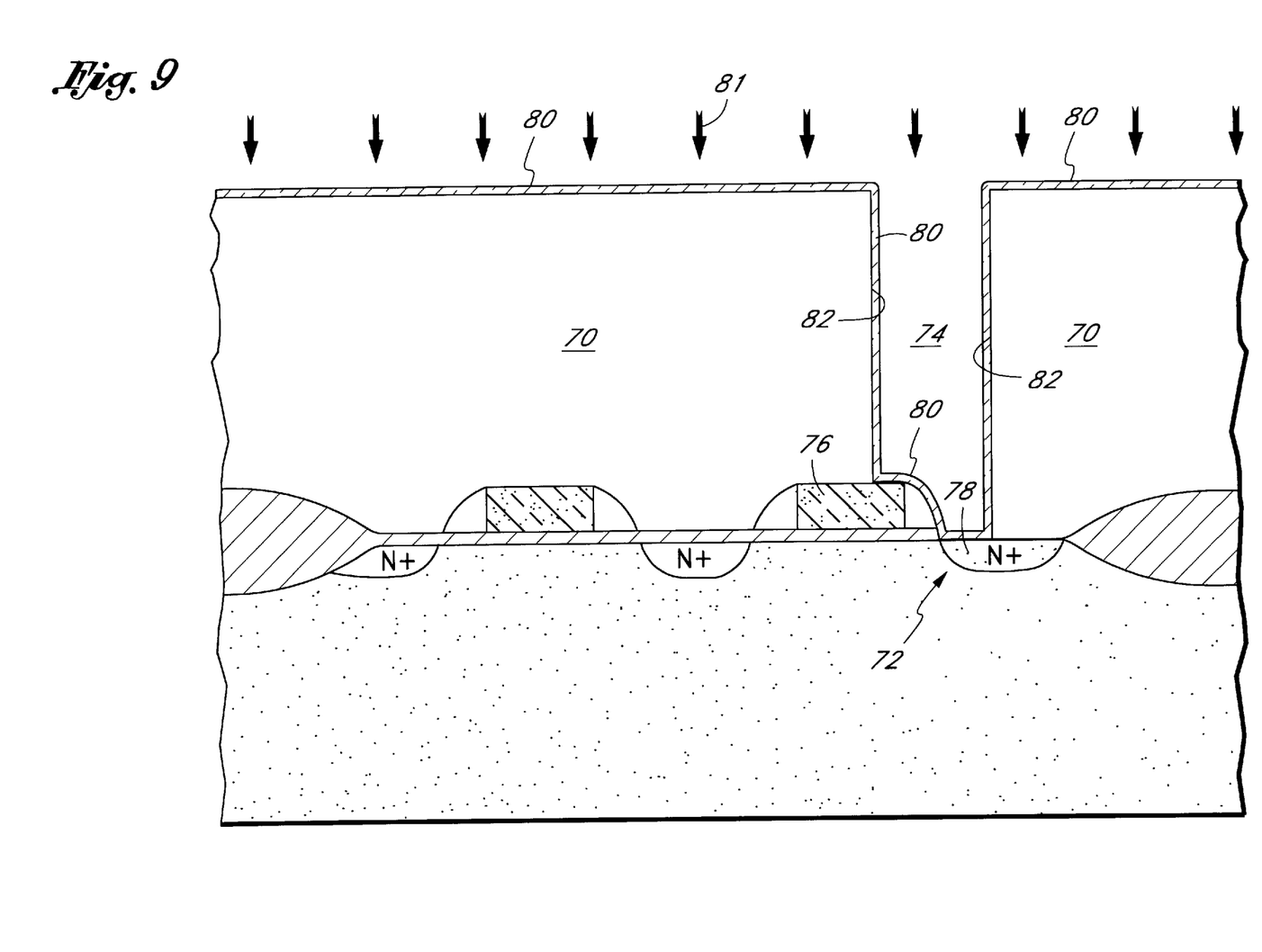
FIG. 9 is a partial schematic sectional view of an integrated circuit constructed in accordance with another embodiment of the present invention.
Figure 10:
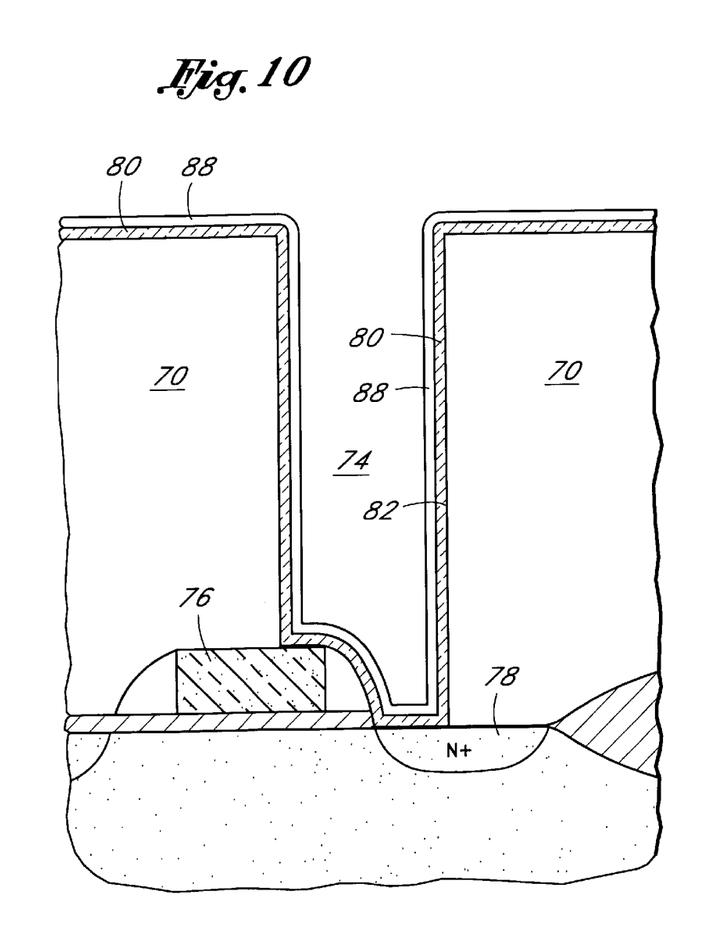
FIGS. 10–13 are partial schematic sectional views of the integrated circuit of FIG. 9, illustrating the method steps of fabricating a resistor and interconnect.

FIG. 9 illustrates a starting point for the embodiment. A relatively thick oxide layer 70, preferably between 5,000 Å and 15,000 Å and most preferably 8,000 Å thick, has been deposited over a transistor 72 of an SRAM cell. A vertical cavity 74 is etched to expose a gate 76. The cavity is preferably between 0.25 $\mu$m and 1.0 $\mu$m in diameter. In the illustrated preferred embodiment, a drain 78 is also exposed in order to later provide a gate-drain strap, as is known in the art of SRAM fabrication. It will be understood that the invention will demonstrate the above-discussed characteristics even if the etch exposes only the gate 76 where no gate-drain strap is required.

A thin layer of polysilicon 80 is deposited conformally over the oxide 70, including a cylindrical vertical sidewall 82 of the cavity 74. Chemical vapor deposition (CVD) is preferred for this deposition, as it ensures a more uniform deposition over the narrow cavity 74. The polysilicon layer 80 is preferably between 200 Å and 1000 Å thick, and most preferably about 500 Å. FIG. 9 illustrates a section of the integrated circuit after the polysilicon 80 has been deposited.

Figure 11:
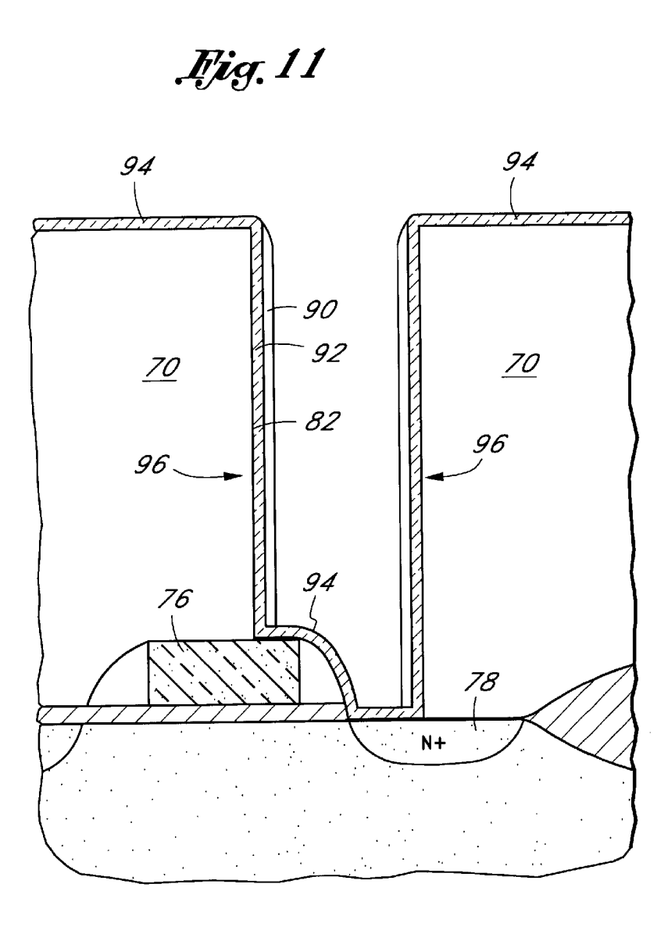

The polysilicon layer 80 may or may not be lightly doped at this point. Though this doping is represented in FIG. 9 by vertical arrows 81, it should be understood that angled implants may be required to dope the polysilicon 80 at the substantially vertical sidewall 82 of the cavity 74. The next step involves conformally depositing a thin insulating layer 88 (FIG. 10), such as an oxide, over the polysilicon 80 so that the insulating layer 88 at least conforms to the cylindrical wall of the cavity 74. This layer may then be anisotropically etched by known processes such as reactive ion etch (RIE). FIG. 11 shows the result of this etch. The oxide layer 88 is removed from the polysilicon 80 everywhere except at the sidewall 82, forming a sidewall spacer 90 over a region 92 where the resistor or load element is to be formed. The sidewall spacer 90 should preferably have a thickness of between about 200 Å and 3000 Å, most preferably about 1000 Å.

Still referring to FIG. 11, a heavy n+ implant, such as arsenic ion implant, may then be performed, doping exposed regions 94 of the polysilicon layer 80. Alternatively, phosphorus or boron may be diffusively doped. As the dopants are driven into the polysilicon layer 80, or during later high temperature steps, the dopants may diffuse slightly under the sidewall spacer 90, but the bulk of the region 92 underlying the spacer 90 is protected from the implant. A back-to-back n-p-n diode, or resistor 96, is thus formed under the sidewall spacer 90. It will be understood that a p-n-p diode may also serve as the load element if the dopant types are reversed, and that same-type doping may be used depending upon the required current through the resistor during circuit operation.

The exposed polysilicon 94 of the circuit may be masked and doped with n-type or p-type dopant depending upon interconnection needs, as will be understood by one of skill in this art. As described with respect to the embodiments first discussed above, this step generally requires a mask both for the present invention as well as in prior art local interconnects whenever both p+ and n+ regions are to be formed in the exposed polysilicon 94.

Figure 12:
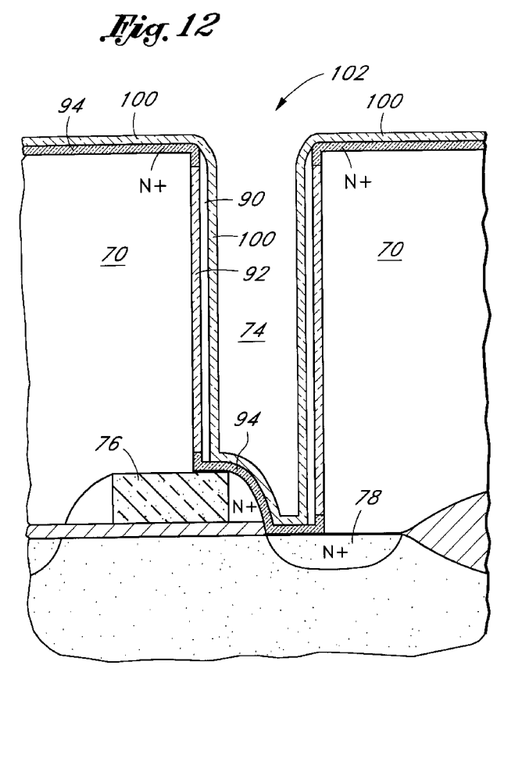

FIG. 12 shows a metal layer 100, preferably refractory metal and most preferably titanium, which is next deposited over the polysilicon 94, including that in the cavity 74. This deposit may be performed by known sputter deposition techniques.

Figure 13:
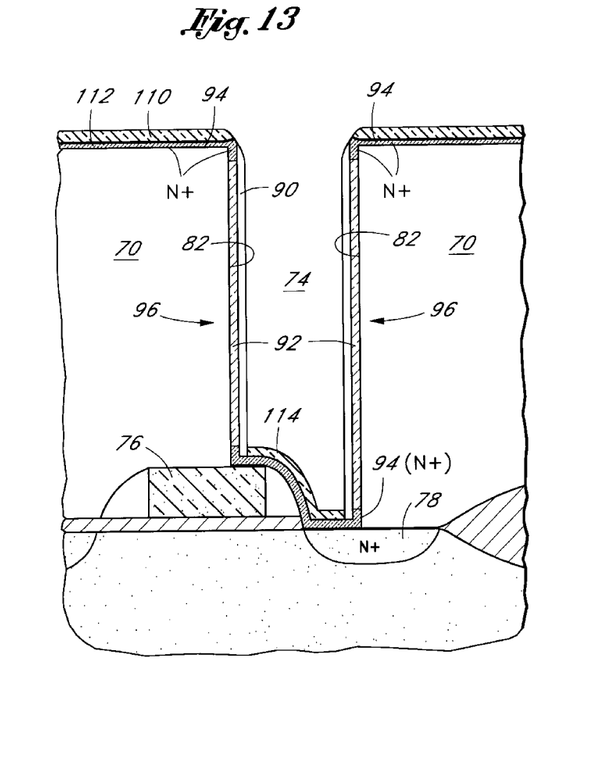

The structure is then sintered using a self-aligned silicidation approach similar to that described with respect to the first embodiment discussed above. As is well known in the art, the titanium reacts with the adjacent polysilicon layer 94 to form a silicide 110, as shown in FIG. 13. However, where the sidewall spacer 90 prevents contact with the shielded polysilicon 92, refractory metal remains unreacted (not shown) over the oxide spacer 90. This and other unreacted metal (as well as titanium nitride byproduct) should be subsequently washed from the circuit by a conventional etching step, as described with respect to the first embodiment, so that the load resistor 96 is not shorted by the excess metal.

The sidewall spacer 90 may or may not be removed. The silicide layer 110 and an unconsumed polysilicon layer 112 may thereafter be patterned for etch as desired for interconnection.

FIG. 13 illustrates the result of this process. The layer of silicide 110 overlies the unconsumed polysilicon 112, which has been doped as required for any interconnection function. The gate 76 and drain 78 are electrically connected by a silicide strap 114. The back-to-back diode resistor 96 of this embodiment is formed by the heavily n-doped exposed regions 94 and the p-doped polysilicon 92 underlying the oxide spacer 90.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

What is claimed:

1. A method of forming a silicide interconnect layer and an integrated resistor in an integrated circuit, the method comprising the steps of:

forming a contact window through a first insulating layer to expose a circuit node;

depositing a polysilicon layer over the first insulating layer after forming the contact window;

depositing a second insulating layer over the polysilicon layer to cover a shielded polysilicon region and define an exposed polysilicon region not covered by the second insulating layer;

depositing a refractory metal layer over the entire exposed polysilicon region; and forming the silicide over the entire exposed polysilicon region and leaving at least an unreacted portion of the exposed polysilicon region underlying the silicide to form the integrated resistor;

wherein the contact window comprises a cavity having a sidewall surface and a bottom surface including the exposed circuit node, and depositing the polysilicon layer comprises depositing the polysilicon layer over a top surface of the first insulating layer and over the bottom surface and the sidewall surface of the cavity, and wherein depositing the second insulating layer deposition comprises:

depositing an insulating material at least over the polysilicon layer over the sidewall surface of the cavity;

depositing the insulating material conformally over the polysilicon layer; and anisotropically etching the insulating material from the top surface of the first insulating layer and the bottom surface of the cavity.

2. The method of claim 1, wherein the anisotropic etch step comprises a reactive ion etch.

3. A method of forming a supply line and an integrated resistor in series with a circuit node of an integrated circuit, the method comprising the steps of:

forming a cavity through an insulating layer to the circuit node, the cavity having a sidewall surface and a bottom surface;

conformally depositing a thin polysilicon layer over a top surface of the insulating layer and over the sidewall and bottom surfaces of the cavity;

depositing a sidewall spacer over the polysilicon layer on the sidewall surface of the cavity to cover a region where the resistor is to be formed;

depositing a refractory metal layer over the polysilicon layer;

sintering the polysilicon and refractory metal layers to form a silicide where the refractory metal layer and the polysilicon layer contact one another, an excess metal product, and an unreacted portion of the polysilicon layer underlying and contacting the silicide to form the integrated resistor; and cleaning the excess metal product.

4. The method of claim 3, wherein the circuit node comprises a transistor gate.

5. The method of claim 3, wherein the circuit node comprises a transistor gate and an active area of a static random access memory cell transistor.

* * * * *